United States Patent [19]

Heikes et al.

[11] Patent Number: 5,798,938
[45] Date of Patent: Aug. 25, 1998

[54] SYSTEM AND METHOD FOR VERIFICATION OF A PRECHARGE CRITICAL PATH FOR A SYSTEM OF CASCADED DYNAMIC LOGIC GATES

[75] Inventors: Craig A. Heikes, Fort Collins, Colo.; Rodolfo G. Beraha, Los Altos, Calif.

[73] Assignee: Hewlett-Packard Co., Palo Alto, Calif.

[21] Appl. No.: 677,432

[22] Filed: Jul. 2, 1996

[51] Int. Cl.⁶ .................................................. G06F 17/50
[52] U.S. Cl. ................................................................ 364/490
[58] Field of Search ........................................ 364/488, 489, 364/490, 491

[56] References Cited

U.S. PATENT DOCUMENTS

| | | | |
|---|---|---|---|
| 5,051,911 | 9/1991 | Kimura | 364/468 |
| 5,095,454 | 3/1992 | Huang | 364/578 |
| 5,126,950 | 6/1992 | Rees et al. | 364/490 |
| 5,517,132 | 5/1996 | Ohara | 326/41 |
| 5,640,547 | 6/1997 | Hotta et al. | 395/555 |
| 5,644,499 | 7/1997 | Ishii | 364/489 |
| 5,657,239 | 8/1997 | Grodstein et al. | 364/488 |

*Primary Examiner*—Emanuel Todd Voeltz
*Assistant Examiner*—Leigh Marie Garbowski

[57] ABSTRACT

The present invention provides a system and method for performing precharge timing verification on a logic circuit comprising a plurality of cascaded logic blocks, where in each logic block is implemented via a dynamic logic gate characterized by having a clock resettable output. In addition, a storage element is connected at each input to the logic circuit. The method of the present invention includes the following steps: preconditioning the storage elements so that all the inputs to the logic circuit are driven high when the clock goes high; transitioning the clock high so as to drive all the inputs of the logic circuit high, thereby driving all the outputs of the logic circuit high and discharging the storage node of each logic block; transitioning the clock low to precharge the storage node of all the logic blocks in the logic circuit, and thereby driving all the outputs low; and determining the longest precharge path in the logic circuit. A precharged timing verification system of the present invention is preferably implemented on a computer system and comprises a dynamic simulation mechanism and a precharge timing mechanism for performing the precharge timing verification timing analysis of the present invention.

23 Claims, 9 Drawing Sheets

SYSTEM AND METHOD FOR VERIFICATION OF A PRECHARGE CRITICAL PATH FOR A SYSTEM OF CASCADED DYNAMIC LOGIC GATES

FIELD OF THE INVENTION

The present invention relates generally to dynamic logic in computers and, more particularly, to systems and methods for verifying the precharge critical path for a system of cascaded dynamic logic gates, such as in a domino logic circuit.

BACKGROUND OF THE INVENTION

One of the most critical design criteria of a central processing unit (CPU) in a computer is the speed at which the CPU operates. This is extremely important because the CPU generally handles and ultimately supervises most of the interactions that occur within the computer. In an effort to increase the speed at which a CPU can process data, "dynamic" logic gates were developed for implementing logic circuits within the CPU. Dynamic logic gates are those which require a periodic electrical precharge, or refresh, such as with a dynamic random access memory (DRAM), in order to maintain and properly perform its intended logic function. Once the electrical precharge supplied to the dynamic logic gate has been discharged, the dynamic logic gate cannot perform another logic function until being precharged again.

Following the discovery of dynamic logic gates, further research directed to increasing the speed at which a CPU can process data led to the development of the "domino" type of dynamic logic circuit, such as the domino logic gate 2 illustrated in FIG. 1. The domino logic gate 2 comprises a number of series-connected transistors for simultaneously processing digital signals and providing a single output node. In general, a plurality of n-channel metal oxide semiconductor field-effect transistors (NMOS FETs) input devices 4 are series connected to provide an AND logic function. A p-channel MOS FET (PMOS FET) 6 is also provided to precharge a logic gate storage node 7 to a predetermined logic state. Depending on the logic state of the input devices, the storage node 7 either remains at the precharge state, or is pulled low through the series-connected devices 4 by a clocked NMOS FET device 8 connected to ground. Accordingly, this configuration is generally referred to as a clocked domino logic gate.

In accordance with the logic function performed at the input of the domino logic gate 2, if all the NMOS FET input devices are driven by a logic high, the storage node 7 of the clocked domino logic gate will be a logic low. Conversely, if any one of the input NMOS FET devices is driven with a logic low, the storage node of the domino logic gate will remain at the precharge logic high state. Because an inversion function is performed with this arrangement, a complimentary MOS FET (CMOS FET) inverter 9 is generally connected to the storage node of the domino logic gate 2 to perform a logic inversion function so that an overall AND function is realized.

In addition to clocked domino logic gates, a modified domino logic gate has also been developed that provides a speed advantage over the clocked domino logic gate, as well as being physically smaller. The modified domino logic gate is configured much like the clocked domino gate with the exception that the modified domino logic gate does not have a clocked NMOS FET device connecting the series-connected PMOS FET devices to ground, i.e., the modified domino logic gate does not have a reset clock for causing a reset of the output. Therefore, because the pull-down portion of the modified domino logic gate contains fewer transistors than that of the clocked domino gate, the modified domino gate is capable of operating at faster speeds. In appreciation of this fact, domino-type logic circuitry often includes a combination of both clocked domino logic gates and modified domino logic gates in order to maximize performance.

In designing dynamic-type logic circuits for implementation in a CPU, various software tools are utilized to perform presilicon test on the design in order to troubleshoot the design and to verify that the design meets the performance benchmarks. With particular relevance to the present invention, presilicon timing verification is one type of presilicon testing that is performed in order to insure that the designed circuit is capable of operating at the desired frequency. Another type of presilicon testing is presilicon functional verification that is performed in order to determine that the circuit functions as desired. The software tools for implementing presilicon timing verification and presilicon functional verification are usually configured to receive a device level netlist of the circuit design and then to process the netlist in order to generate an output of a particular operating characteristic. Several examples of commercially available software tools for performing presilicon testing are TimeMill®, PowerMill® and PathMill®, all which are manufactured by Epic Design Technologies, Inc., San Francisco, Calif., U.S.A.

In performing presilicon timing verification, the precharge critical path of the circuit is measured. For purposes of the present disclosure, the precharge path of a dynamic logic gate is the time period from when the clock signal falls low until the output signal falls low, that is, the time it takes the output to reset after the clock resets. Further, for purposes of the present disclosure, the critical path is the longest path of the circuit under evaluation. In regard to measuring the precharge critical path, essentially two methods are currently being used: static timing analysis and dynamic timing analysis. However, each of these methods has associated with it several disadvantages, a few of which are delineated below.

In static timing analysis, all the logic gates in a particular circuit must be characterized. This can be a time consuming task since most designs consist of several hundred logic gates that must be individually characterized, independent of one another. In order to find the total precharge delay through the circuit, all the individual delays of each logic gate in the circuit are added together. In addition to being relatively time consuming, this method produces inaccurate results because drive fights occur in the modified domino logic gates because they are not modeled accurately with static timing analysis. Particularly, with reference to FIG. 2A wherein a modified domino logic AND gate 10 is illustrated, the relative timing difference between the inputs 1 and 2 at the pull-down transistors 12 and 14, respectively, and the clocked pull-up transistor 16 are not known when characterizing each logic gate separately, as is done with static timing analysis. Thus, it may be the case that the gate input of the clocked pull-up transistor 16 goes low prior to the inputs 1 and 2 going low. In this case, the pull-down transistors 12, 14 are trying to pull the storage node 18 low, while the clocked pull-up transistor 16 is trying to pull the storage node 18 high. A timing diagram 20 of the modified domino logic gate 10 is provided in FIG. 2B, wherein such a drive fight occurs during a period 22. Thus, the storage node 18 will not precharge high until both inputs 1 and 2 go low. This has the net result of increasing the precharge time for the AND gate 10.

Accordingly, with modified domino logic gates, the timing between the inputs 1, 2 and the clock must be accounted for in order to obtain an accurate measurement of the precharge time. However, the timing between the inputs and output of the different logic gates within a dynamic logic circuit will be different depending upon where the gate is in the logic chain and what type of logic gates control its inputs. Thus, as discussed above, a slight difference in the relative timing between the inputs 1, 2 and the clock can affect the precharge time which, however small for a single gate, can add up to a substantial amount when connecting gates together.

In dynamic timing analysis, some of the disadvantages of static timing analysis are overcome, though this technique has several disadvantages of its own. For instance, in dynamic timing analysis, a part of the circuit is extracted into a device level netlist and run (i.e., simulated) to analyze the precharge delay for the extracted portion of the circuit. However, most circuits are too large to simulate as a whole circuit in a device level netlist, and therefore, the circuit must be broken up into smaller pieces, which are run separately. Performing multiple simulations in this manner is a very time consuming task that is only becoming more and more time consuming as the number of components in an integrated circuit increases. Further, dynamic timing analysis is vector dependent, meaning that for each simulation a correct input stimulus must be generated so that each storage node in the path discharges. Again, with the increasing complexity of the integrated circuits presently being designed, this analysis requires increasingly more complex input vectors that must be engineered.

Thus, a heretofore need exists in the industry for a system and method for measuring the precharge critical path in a dynamic logic circuit that is performed in one simulation that, is vector independent, that does not require the characterization of the precharge path of each gate in a circuit, and that is highly accurate.

SUMMARY OF THE INVENTION

The present invention overcomes the inadequacies and deficiencies of the prior art as discussed hereinbefore and as well known in the industry. In general, the present invention can be thought of as a novel method for performing presilicon timing verification in a system of cascaded dynamic logic gates, such as but not limited to, domino logic gates. By utilizing this method, all the precharge times in a system of logic gates can be measured in a single simulation. The precharge times can then be compared to a design specification in order to determine if the precharge timing within the logic circuit meets system requirements, that is, whether the system is capable of operating at its designed frequency.

In particular, provided by the present invention is a dynamic timing analysis method that can accurately simulate logic gates that may not have a clocked pull-down chain, that is vector independent, that does not require the characterization of each logic gate, and that can produce results for the entire logic circuit in one simulation. This method essentially combines the benefits of the current static and dynamic timing analysis methodologies without the disadvantages of said methodologies.

Briefly stated, a method in accordance with the present invention performs precharge timing verification on a cascaded logic circuit. The logic circuit comprises a plurality of logic blocks arbitrarily cascaded and configured for performing a particular logic function in a single clock phase domain, and has storage elements at the inputs and outputs of the logic circuit. The method of the invention includes the following steps. Initially, all the storage elements (e.g., flip-flops) that are connected to the inputs of the logic circuit are preconditioned to drive the circuit inputs high when the clock of the circuit goes high. The logic circuit then waits for the clock to transition high, at which time the inputs to the logic circuit are all driven high by the preconditioned storage elements. This results in the outputs of each logic block being driven high. In driving the outputs high, the storage node of every logic block is brought down to zero in that the storage node and the output are merely inverses of one another. This action is referred to as "discharging the storage nodes." Next, the clock is transitioned low so as to begin the transition of all the storage nodes back to a logic high. This action is referred to as "precharging the storage nodes." Since all the storage nodes have been flushed, that is, discharged, all the storage nodes are being precharged by driving the clock low. However, not all the storage nodes transition at the same time because the cascaded architecture of the logic circuit produces precharge paths of different lengths. Further, the number of logic blocks within a given precharge path may vary as well as the type of logic gate within each logic block. Particularly, the precharge times vary between logic blocks based upon the type of logic gate that is implementing the logic block. For example, a clocked domino logic gate is faster to precharge than a modified domino logic gate.

Thus, if all the storage nodes in the logic circuit are precharging, the last path in time through the circuit to precharge is the precharge critical path. Knowing the precharge critical path, verification can be made as to whether the logic circuit will reset correctly in a precharge state before the next function has to be evaluated. This ensures that the circuit is able to operate at its designed frequency.

Preferably, the presilicon timing verification method of the present invention is implemented in software on a computer system in order to perform presilicon timing verification. Thus, the present invention provides for a timing verification mechanism that can be employed on a computer system and configured to process a device level netlist of a logic circuit design, such as a Spice model. The timing verification mechanism produces a list of the timing transitions for all the storage nodes in the logic circuit from which the precharge critical path can be easily determined, either manually or automatically via the computer system.

The timing verification mechanism comprises a dynamic simulator mechanism and a precharge timing mechanism. For purposes of the present invention, the dynamic simulator mechanism can be any one of several commercially available dynamic simulation programs, such as TimeMill® by Epic Design Technologies. The timing verification mechanism is configured to receive a device level netlist and send the netlist to both the dynamic simulator mechanism and the precharge timing mechanism. The precharge timing mechanism generates a command message designating the preconditioning of the storage elements in the logic circuit, and then sends the command message to the dynamic simulator mechanism. The dynamic simulator mechanism utilizes the command message to process the netlist so as to generate a list of transition times for all the elements in the logic circuit. The list of transition times is then sent to the precharge timing mechanism where it is processed to produce a listing of transition times for all the storage nodes in the circuit. The listing of transition times for the storage nodes can then be utilized to determine the precharge critical path by either manually selecting the longest precharge path time or by providing a subroutine program as a part of the timing verification mechanism that will automatically select the longest precharge critical path and designate that path accordingly.

The precharge timing verification system and method of the present invention have many advantages, a few of which are delineated hereafter as examples.

An advantage of the precharge timing verification system and method of the present invention is that they provide an accurate measurement of the precharge path of logic gates that do not have a clocked pull-down transistor.

Another advantage of the precharge timing verification system and method of the present invention is that they enable precharge timing verification that is vector independent, that does not require the characterization of each logic gate, and that can be performed in a single simulation.

Another advantage of the precharge timing verification system and method of the present invention is that they provide for greater flexibility, enhanced performance, and greater accuracy, as compared to static timing analysis and dynamic timing analysis methodologies. Particularly, the precharge timing verification system and method of the present invention are applicable to any dynamic logic family that is characterized by having a clock resettable output, such as precharge logic, pre-discharge logic, or zipper logic.

Another advantage of the precharge timing verification system and method of the present invention is that they enable the measurement of the maximum clock offset within a logic circuit.

Other features and advantages of the present invention will become apparent to one with skill in the art upon examination of the following drawings and detailed description. It is intended that all such additional features and advantages be included herein within the scope of the present invention, as is defined by the claims.

BRIEF DESCRIPTION OF THE DRAWINGS

The present invention can be better understood with reference to the following drawings. The elements of the drawings are not necessarily to scale, emphasis instead being placed upon clearly illustrating the principles of the present invention. Furthermore, like referenced numerals designate corresponding parts throughout the several views.

DETAILED DESCRIPTION OF THE PREFERRED EMBODIMENT

The following description is of the best presently contemplated mode of carrying out the present invention in the context of performing precharge timing verification analysis on a logic circuit comprising a plurality of cascaded logic blocks that are implemented via domino logic gates. However, as can be appreciated by one of ordinary skill in the art, the present invention is equally applicable to other dynamic logic families that are generally characterized as having a clock resettable output, for example, mousetrap logic. Thus, this description is not to be taken in a limiting sense but is made merely for the purpose of describing the general principles of the invention. The scope of the invention should be determined by referencing the appended claims.

I. Precharge Timing Verification

Figure 1:
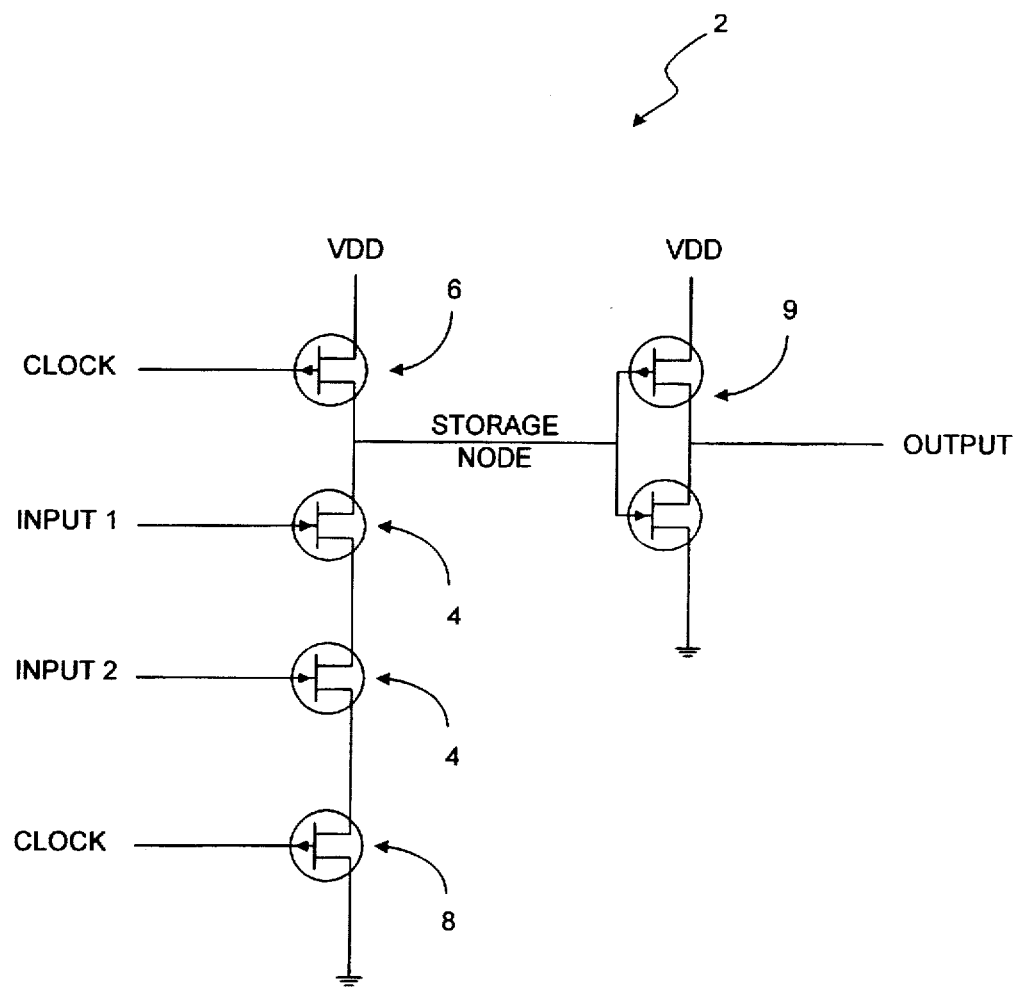
FIG. 1 is a circuit diagram of an illustrative embodiment of a clocked domino logic gate.
Figure 2A:
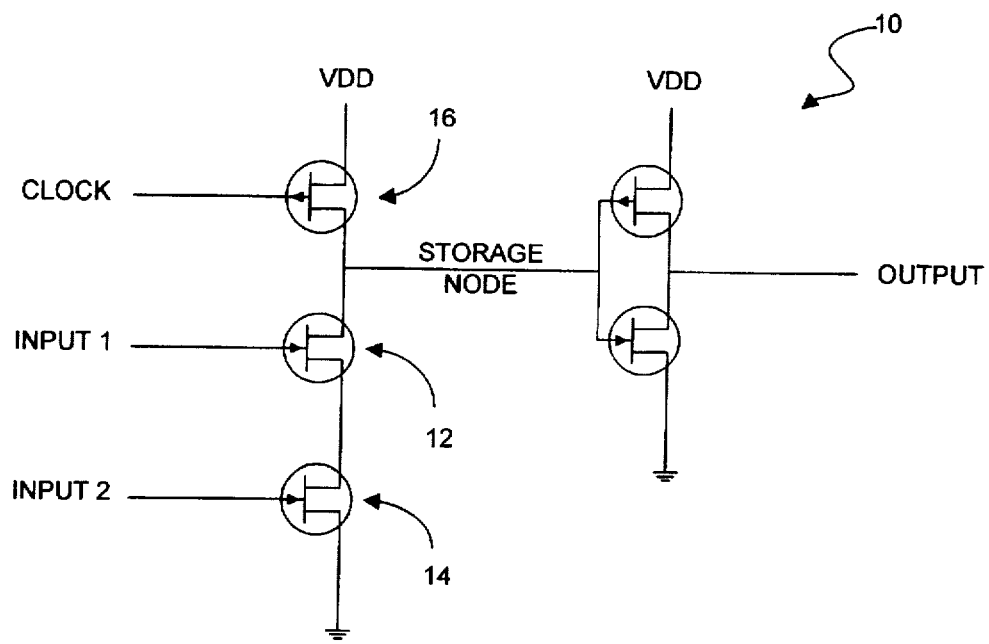
FIG. 2A is a circuit diagram of an illustrative embodiment of a modified domino logic gate.
Figure 2B:
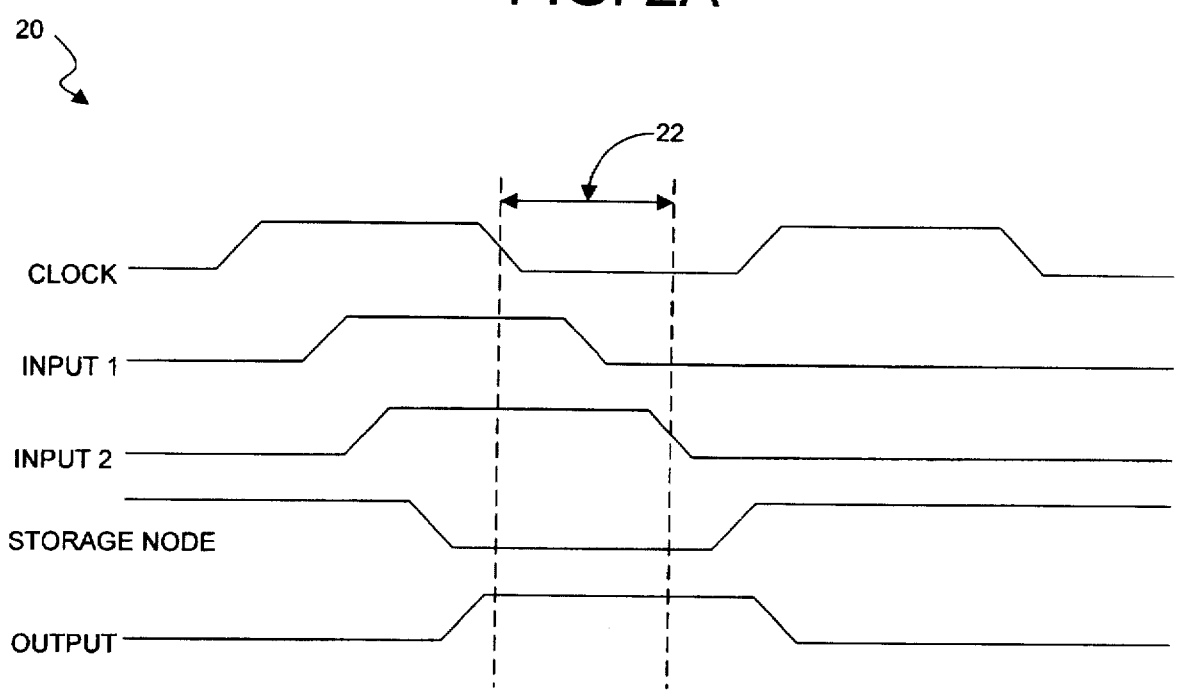
FIG. 2B is an example of a timing diagram illustrating a drive fight in the modified domino logic gate of FIG. 2A.
Figure 3:
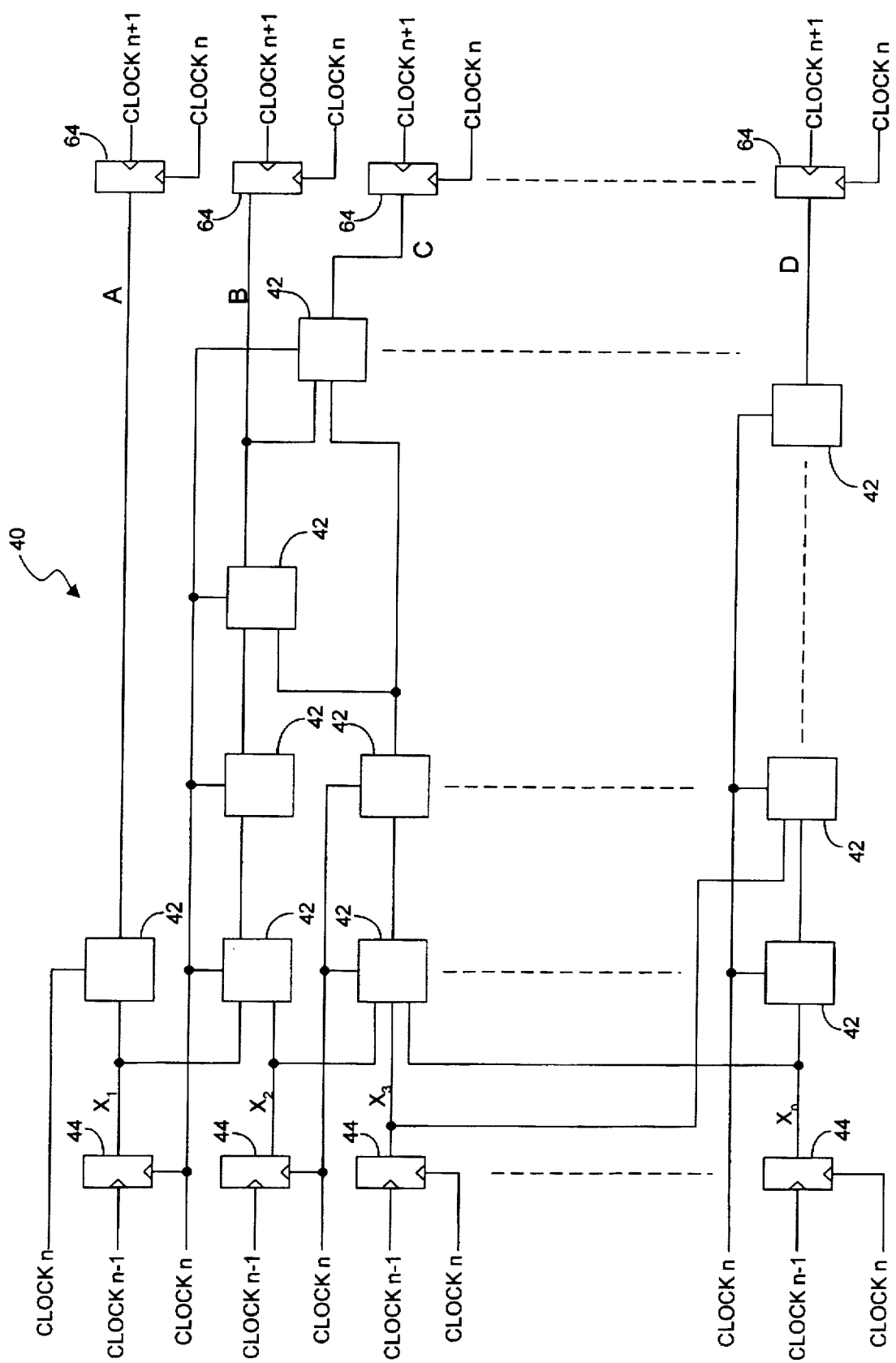
FIG. 3 is a schematic diagram of a dynamic logic circuit comprising cascaded logic blocks for performing a particular logic function.

With reference to FIG. 3, shown is a logic circuit 40 that is typical of the type used to implement a logic function in a central processing unit (CPU) and that is subject to presilicon timing verification in order to ensure its proper operation. For purposes of the present disclosure, the logic circuit 40 comprises a plurality of cascaded logic blocks 42 that are implemented with domino logic gates, such as the modified domino logic gate 10 illustrated in FIG. 2A and/or a clocked domino logic gate (not shown, though well known in the industry) for performing logic evaluations. The cascaded logic blocks 42 are interconnected to create multiple signal paths through the logic circuit 40 extending from inputs $X_1$–$X_n$ to outputs A, B, C, and D.

Figure 4:
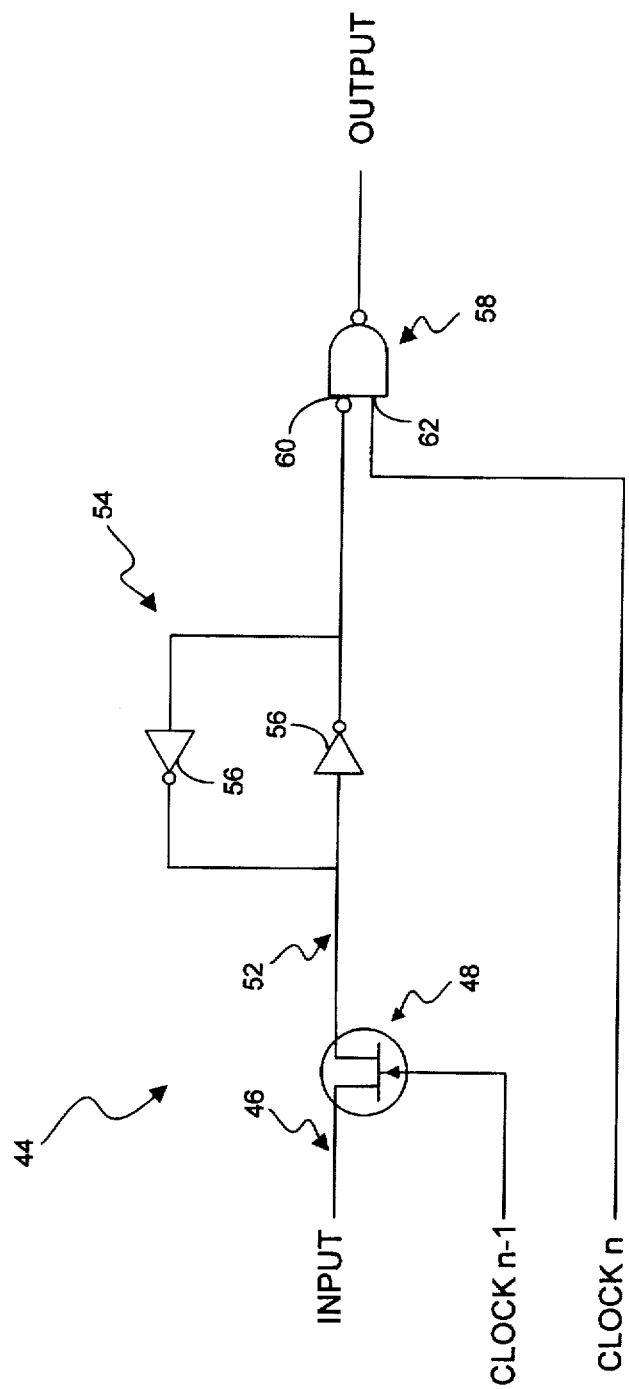
Fig. 4 is a schematic circuit diagram of a flip-flop for implementing the storage elements in the storage elements in the dynamic logic circuit of FIG. 3

Each of the inputs $X_1$–$X_n$ is connected to a storage element 44 that is preferably implemented as a flip-flop, as illustrated in 4. Referring to FIG. 4, the flip-flop 44 comprises an input 46 connected to the drain of a transistor 48. The transistor 48 is controlled by a clock n–1 that is connected to a gate of the transistor 48. At the source of the transistor 48 is a preconditioned node 52 that is preconditioned as part of the timing verification methodology of the present invention, as we will be discussed in great detail below. The preconditioned node 52 is connected to an inverter latch 54 for inverting and latching the valued of the preconditioned node 52. The inverter latch 54 comprises two inverters 56 that are connected in a loop configuration. The output of the inverter latch 54 is itself inverted at a first input 60 of an AND gate 58. A clock signal is placed on a second input 62 of the AND gate 58. The output of the AND gate 58 is connected to one of the inputs $X_1$–$X_n$ of logic circuit 40 (FIG. 3).

Thus, the preconditioned node 52 can be preconditioned with a value from the input 46 by providing a logic high signal to the transistor 48 via the clock n–1, thereby making transistor 48 conductive. The value at input 46 is then received at preconditioned node 52 where it is latched and inverted by the output of the inverter latch 54. The output of the inverter latch 54 is inverted back to the value at the preconditioned node 58 for input into the AND gate 58. Therefore, in accordance with the present invention, the preconditioned node 52 can be preconditioned high so that the input to the AND gate 58 from the inverter latch 54 is high. Subsequently, when the clock in signal goes high, the output of the flip-flop 44 also goes high, resulting in the corresponding input $X_1$–$X_n$ going high.

With reference back to FIG. 3, a storage element 64 is connected to each of the outputs A–D of the logic circuit 40 and is preferably implemented as a flip-flop substantially identical to the flip-flop 44 in FIG. 4. Accordingly, the logic values at outputs A–D are inputted into the respective flip-flops 64, where the values are saved for input into the next clock phase domain.

Figure 5:
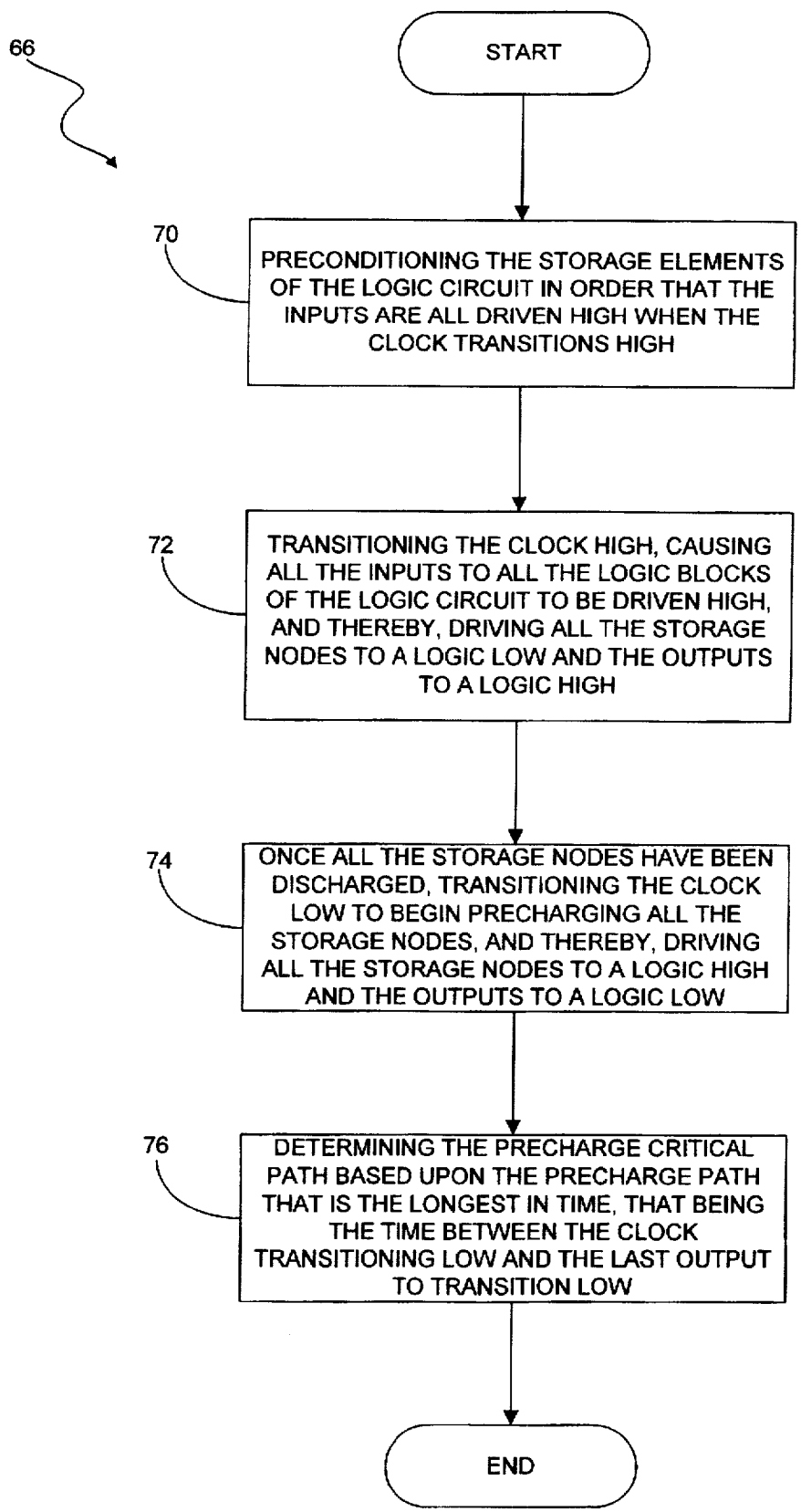
FIG. 5 is a flowchart of a precharge timing verification method in accordance with the present invention.

With reference now to FIG. 5, a flowchart 66 sets forth a process for performing precharge timing verification analysis in accordance with the present invention is provided. The methodology of flowchart 66 can be performed on the logic circuit 40 in order to determine if the precharge critical path of the circuit meets design specifications, that is, whether the dynamic logic gates implementing the logic blocks 42 reset in time before the next function is to be evaluated. In addition, a timing diagram 68 illustrating the timing of the methodology of FIG. 5 is provided in FIG. 6. With general reference to FIGS. 5 and 6, the preconditioned node 52 of each flip-flop 44 (FIG. 4) is preconditioned with logic high values so that the output of the flip-flops 44 drive the inputs $X_1-X_n$ high when the clock transitions high, as indicated at block 70 of FIG. 5. Thus, when the clock n transitions high at time $t_1$ (FIG. 6), the inputs $X_1-X_n$ also transition high, thereby causing all the outputs A–D to also go high, as indicated at block 72 (FIG. 5). As an integral part of the present invention, it is noted that in a logic circuit 40 that is implemented with both clocked and modified domino logic gates, when all the inputs $X_1-X_n$ are driven high, the storage nodes (e.g., the storage node 18 of the modified domino logic gate illustrated in FIG. 2A) are driven low. The values on the storage nodes are then inverted so that the output of each logic gate is high. This is referred to as discharging the storage nodes.

Next, at time $t_2$, the clock n is transitioned low to initiate the precharging of the storage nodes. This is indicated at block 74 in FIG. 5. The elapsed time between time $t_1$ and time $t_2$ should be long enough to ensure that all the storage nodes discharge before the precharge cycle, for example, two to three clock cycles. Accordingly, since all the storage nodes are discharged (i.e., flushed) before the precharge cycle, the precharge time being observed is that of all the gates in each precharge path.

Note, as mentioned in the Background section, the precharge time of a modified domino gate (FIG. 2A) is dependent upon the values at inputs 1 and 2. Only when one of inputs 1 or 2 goes low will the storage node 16 begin to precharge. In comparison, the storage node of a clocked domino gate (as well known in the industry) begins to precharge when the clock transitions low, independent of the values at its inputs 1 and 2. As a result, the modified domino logic gate 10 is susceptible to drive fights which impact the time needed to precharge the gate. Accordingly, where this phenomenon was not taken into account with static timing analysis, the precharge timing verification analysis of the present invention is able to accurately simulate modified domino logic gates.

Figure 6:
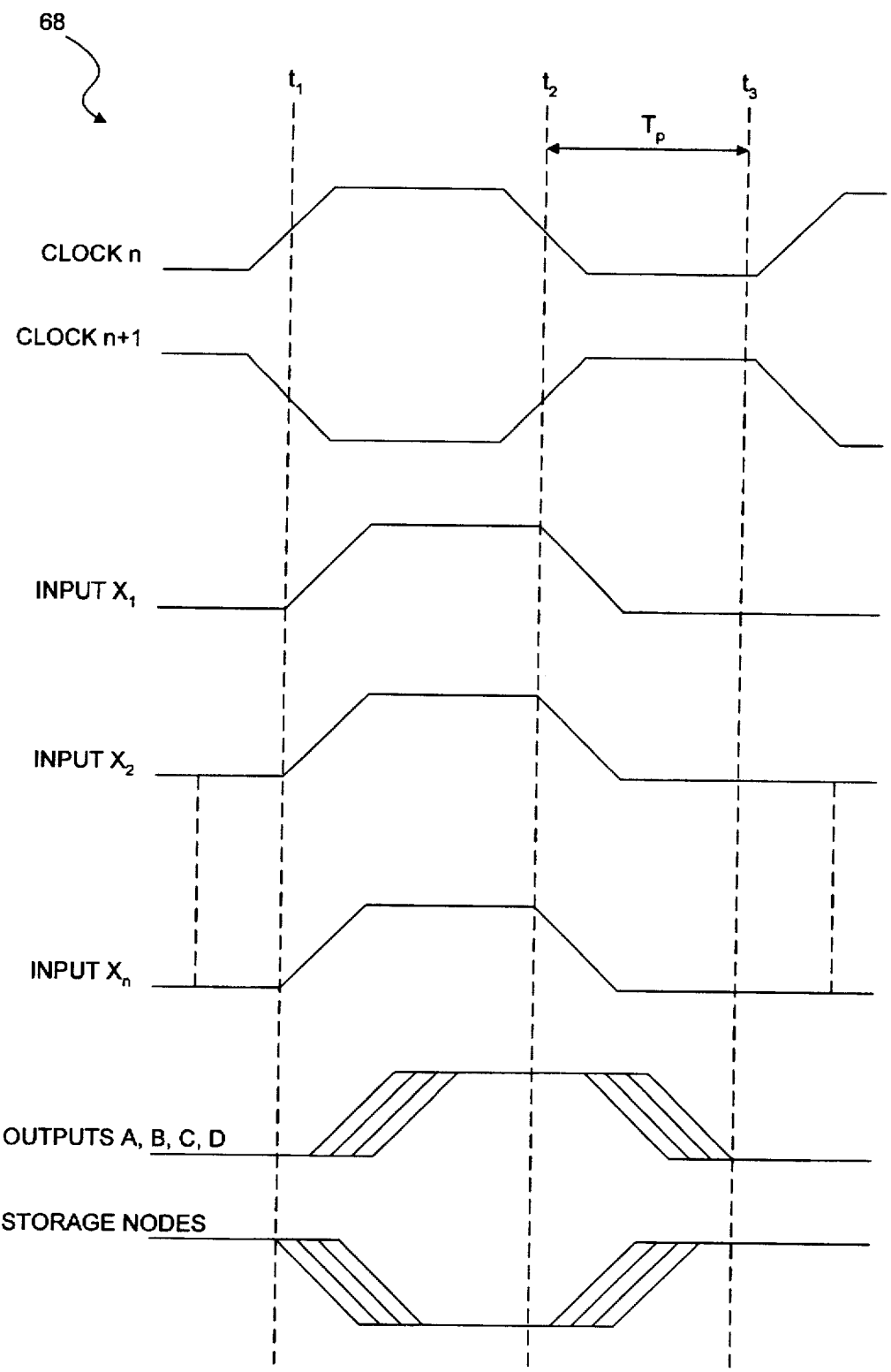
FIG. 6 is a timing diagram illustrating the precharge timing verification performed in FIG. 3 on the dynamic logic circuit of FIG. 3.

As the outputs A–D transition low during the precharge state, the precharge critical path is the last output to transition low. Thus, the precharge time $T_p$ for the logic circuit 40 is the difference between the time the clock n transitions low and when the last output transitions low, as indicated in block 76 of FIG. 5. With reference to FIG. 6, the precharge critical path can be defined by the equation $T_p = t_3 - t_2$, where $t_2$ is when the clock n transitions low and $t_3$ is when the last output transitions low. It is worth noting that all the precharge paths of logic circuit 40 are measured in one simulation, independent of an input vector.

II. Clock Offset Determination

It is known that, for a variety of reasons, the clocks within a logic circuit have a designed phase relationship, or "offset", typically 0°, 90°, or 180°. Thus, the signals from the clocks n and n+1 are seldom synchronized as suggested by the timing diagram 68 of FIG. 6, but are, in fact, offset as more accurately illustrated in the timing diagram 80 of FIG. 7. Moreover, because of the physical features of a logic circuit when implemented, there is usually some difference between the designed offset and the actual offset, which is referred to as the "skew."

Figure 7:
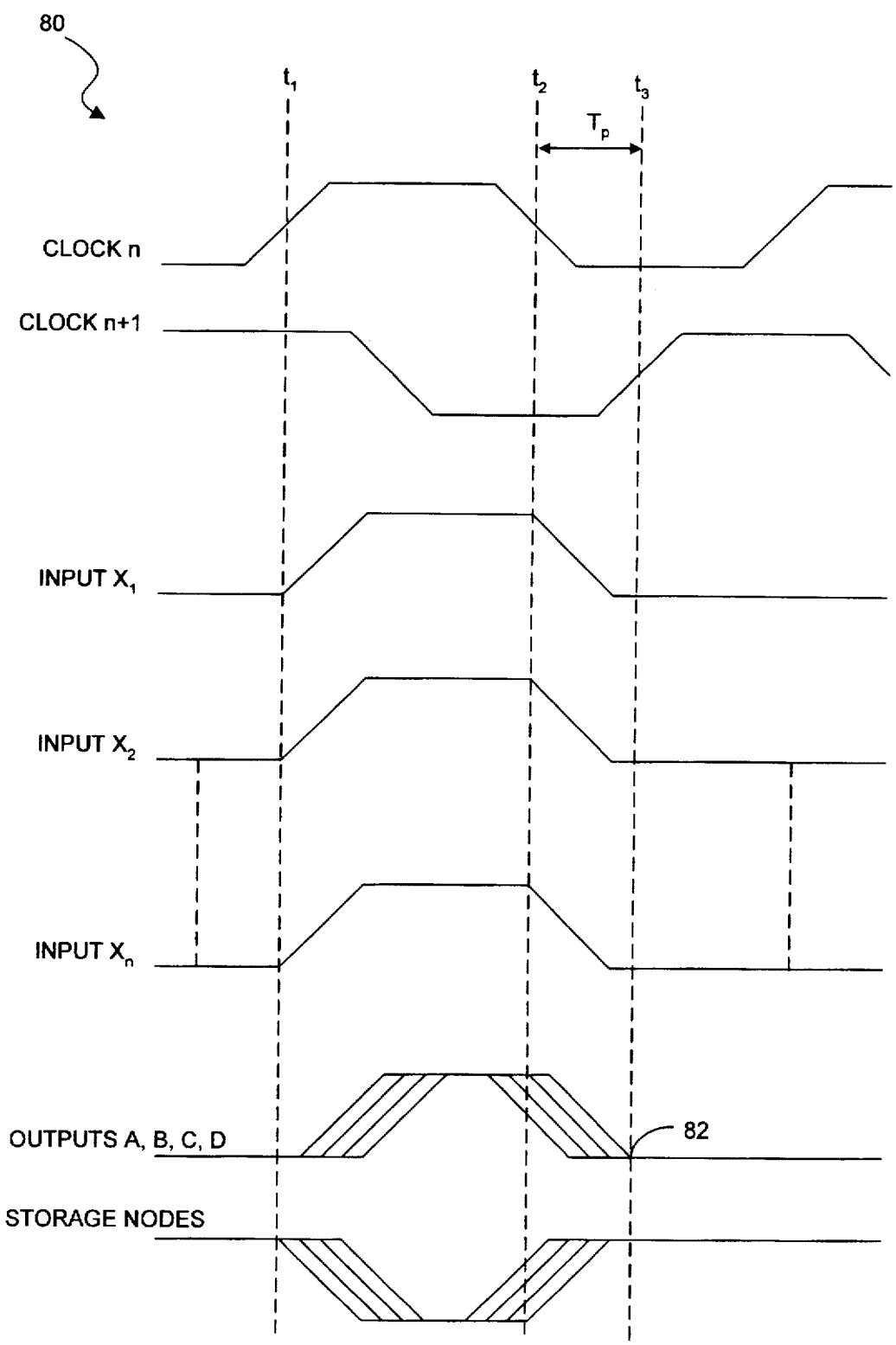
FIG. 7 is a timing diagram illustrating the maximum clock offset of a dynamic logic circuit in accordance with the methodology of the present invention.

The offset, including any skew, between clocks n and n+1 becomes problematic when the offset is so great that the outputs A–D precharge away before the clock n+1 goes high. If this occurs, then the flip-flop 64 (FIG. 3) reads the wrong logic output data at time $t_3$ on the corresponding one of outputs A–D. Thus, as shown in FIG. 7, the longest precharge time $T_p$ not only defines the precharge critical path but also defines the maximum clock offset 82. Stated differently, the clocks n and n+1 can be offset only as much as $T_p$, but no more, or the logic circuit may produce erroneous outputs because the data read by clock n+1 has been prematurely precharged away.

Therefore, by calculating the precharge time $T_p$ in the logic circuit 40, the maximum clock offset may be determined by identifying the longest precharge path. In addition, one of skill in the art would be able to ascertain the maximum skew from knowing the designed offset and the precharge time $T_p$.

III. Computer Implementation

A precharge timing verification system in accordance with the present invention can be stored on any computer-readable medium for use by or in connection with a computer-related system or method. In the context of this document, a computer-readable medium is any electronic, magnetic, optical, or other physical device or means that can contain or store a computer program used by or in connection with a computer-related system or method.

Figure 8:
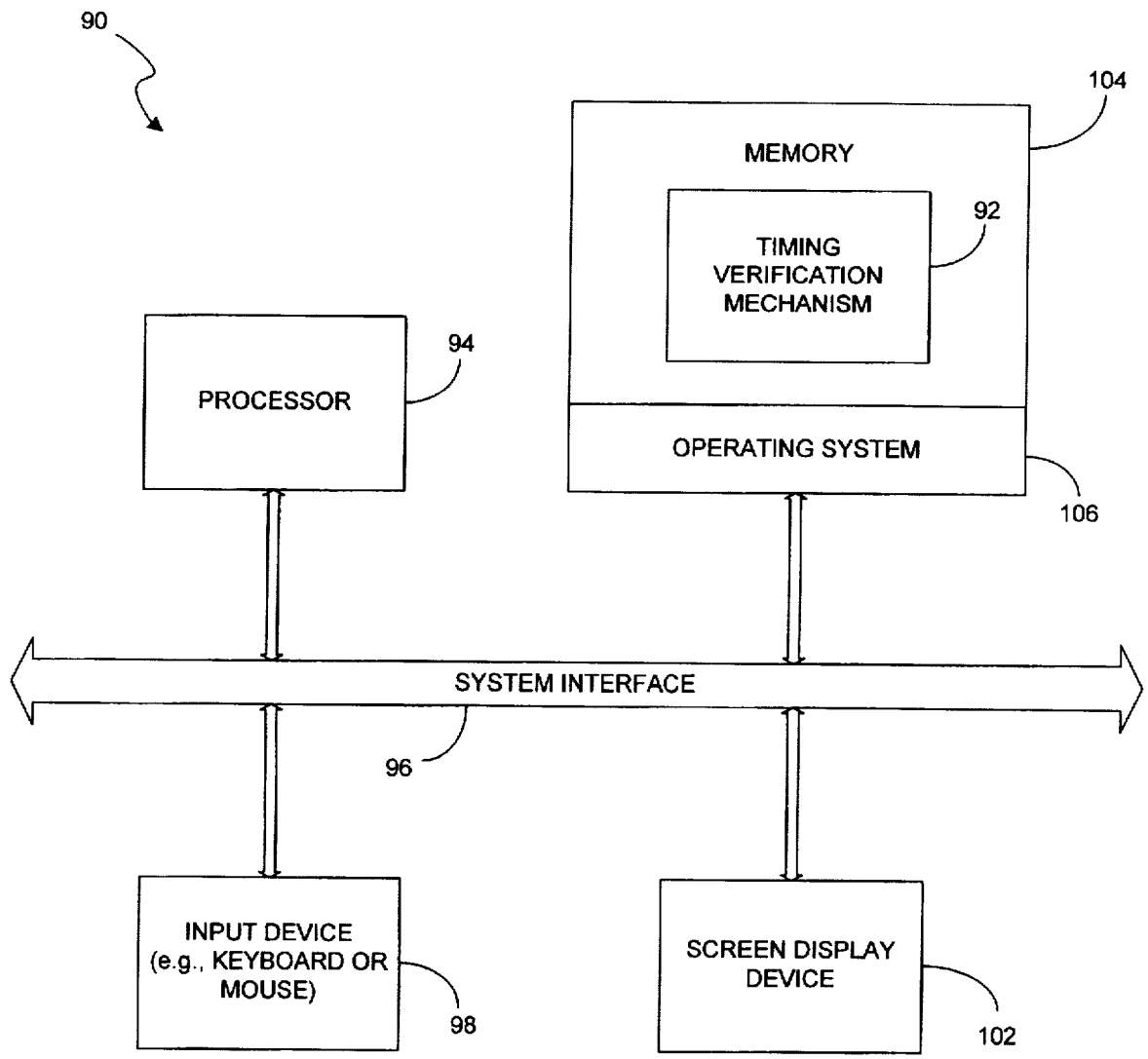
FIG. 8 is a schematic illustration of a computer system employing a timing verification mechanism of the present invention.

As illustrated in FIG. 8, a precharge timing verification system of the present invention is implemented in a computer system 90 as a timing verification mechanism 92. The computer system 90 comprises a conventional processor 94 that communicates with other elements within the computer system 90 via a bus network 96. An input device 98, for example, a keyboard or mouse, is used to input data from a user of the computer system 90, and a screen device 102 is used to output data to the user. A memory 104 within the computer system 90 stores the timing verification mechanism 92 as executable instructions (i.e., a computer-readable program) that cause the computer system 90 to function in a particular fashion in order to achieve the particular functionalities discussed herein. A conventional operating system 106 performs and manages the computer applications on the computer system 90, including the operation of the timing verification mechanism 92.

Figure 9:
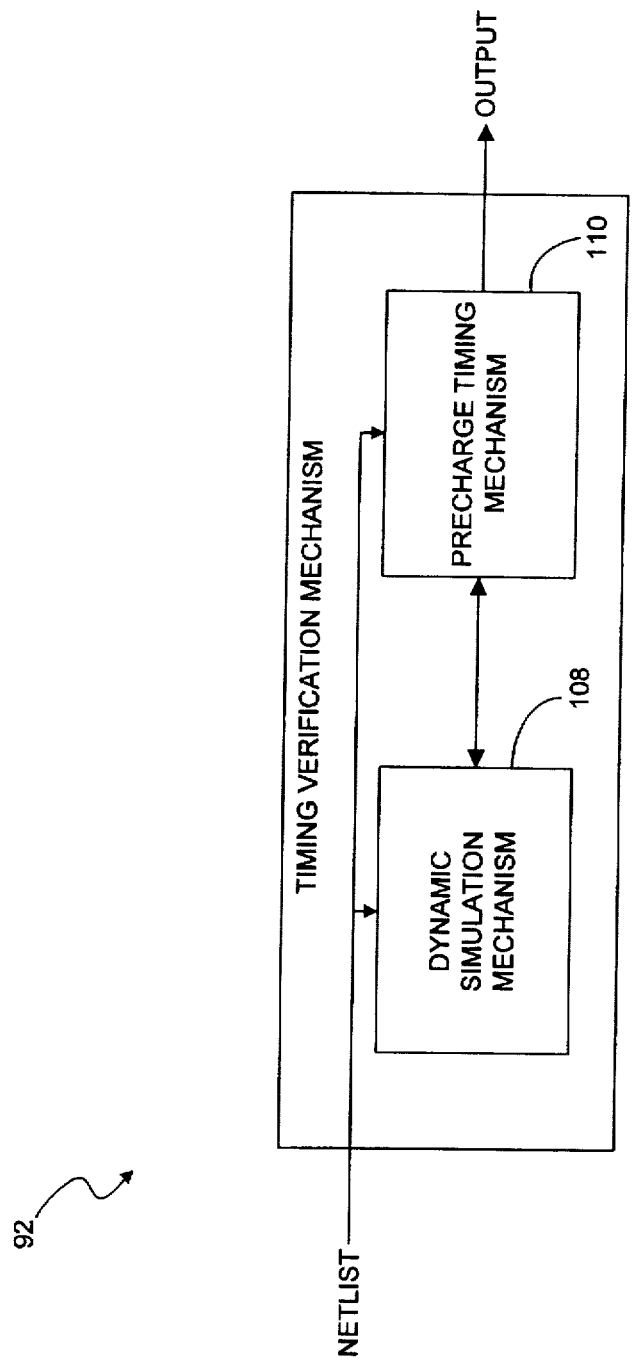
FIG. 9 is a schematic block diagram of the timing verification mechanism of FIG. 8.

With reference now to FIG. 9, the timing verification mechanism 92 comprises a timing simulation mechanism 108 and a precharge timing mechanism 110. The dynamic simulation mechanism 108 and the precharge timing mechanism 110 are interfaced as shown.

In operation, the dynamic simulation mechanism 108 and the precharge timing mechanism 110 are configured to receive a device level netlist inputted into the computer system 90 by the user. For purposes of illustrating the present invention, the device level netlist comprises a Spice model of the logic circuit being tested, such as the logic circuit 40 (FIG. 3). The Spice netlist is essentially a listing of all the elements of the logic circuit 40 and their connectivity, as is well known in the industry. The precharge timing mechanism 110 initially processes the Spice netlist and produces a command message comprising the preconditioning performed on the preconditioned nodes 52 of the flip-flops 44, as described hereinbefore. The command message is then sent to the dynamic simulation mechanism 108.

The dynamic simulation mechanism 108 processes (i.e., simulates) the netlist using the preconditioned flip-flops in order to produce a list of transition times for each element in the netlist. Several commercially available dynamic simulators are suitable for implementing the dynamic simulation mechanism 108, such as TimeMill manufactured by Epic Design Technologies U.S.A. The list of transition times is then sent to the precharge timing mechanism 110 for further processing.

The precharge timing mechanism 110 then processes the list of transition times so as to produce a second list of transition times for the storage nodes of each logic block 42 in the logic circuit 40. In the listing of storage node transition times, the last storage node to precharge provides the precharge critical path. This can be determined manually or by the computer system 90. For instance, the precharge critical path can be determined manually by finding a storage node within the list of storage node transition times that transitions last, that is, the dynamic logic gate that takes the longest to precharge. Alternatively, the computer system 90 can be programmed to select the last storage node to transition from the list of storage node transition times.

In either case, once the particular logic gate with the last storage node to transition is identified, the output of that particular logic gate is the last logic gate to have its output transition low. This is because the output of the logic gate is merely an inverse of the value of the storage node. Therefore, the time for the output of this particular logic gate to transition low, once a clock has transitioned low, is the precharge time $T_p$. The precharge time $T_p$ can then be compared to the designed operating frequency of the logic circuit 40 in order to determine if the precharge cycle will be completed in time before the next evaluation cycle. In addition, the precharge time $T_p$ can be utilized to determine the maximum clock offset allowable in the logic circuit 40, as discussed above.

In concluding the detailed description, it should be noted that it will be obvious to those skilled in the art that many variations and modifications may be made to the preferred embodiment without substantially departing from the principles of the present invention. All such variations and modifications are intended to be included herein within the scope of the present invention, as set forth in the following claims.

Wherefore, the following is claimed:

1. A method for determining a precharge critical path in a system of cascaded dynamic logic gates, wherein each said dynamic logic gate includes a lock resettable output, said method comprising the steps of:

provding said system of said cascaded dynamic logical gates;

discharging a storage node of each said logic gate in said system;

precharging each said storage node once said storage nodes have been discharged; and determining which one of said logic gates takes longest to precharge.

2. The method of claim 1, wherein the step of discharging comprises the steps of preconditioning a storage element connected to each input of said system with a preconditioned value, and transitioning a clock of said system high so as to drive all said inputs to said preconditioned value, wherein said preconditioned value is a logic high value.

3. The method of claim 2, wherein said storage element is a flip-flop.

4. The method of claim 1, further comprising the step of determining a maximum clock offset from said logic gate that takes longest to precharge.

5. The method of claim 1, wherein said logic gate is a domino logic gate.

6. The method of claim 1, wherein the step of precharging comprises the step of transitioning a clock of said system low once said logic gates have been discharged so as to cause said storage nodes to be driven to a logic high value.

7. The method of claim 6, further comprising the step of identifying a precharge critical path as a logic gate output that takes longest to transition low after said clock transitions low.

8. A method for precharge timing verification of a logic circuit comprising domino logic gates with storage elements connected to each input of said logic circuit, comprising the steps of:

providing said logic circuit having said domino logic gates;

preconditioning each said storage element so that each said storage element outputs a logic high value when a clock of said logic circuit transitions high;

transitioning said clock high so as to discharge a storage node of each said logic gage to a logic low value by driving all inputs to said logic circuit high;

transitioning said lock low after said storage nodes have been discharged so as to precharge said logic gates; and identifying a precharge critical path as a logic gate output that takes longest to transition low after said clock transitions low.

9. The method of claim 8, further comprising the step of determining a maximum clock offset from said precharge critical path.

10. A precharge timing verification mechanism for enabling determination of a precharge critical path in a logic circuit of cascaded dynamic logic gates, wherein each said dynamic logic gate includes a clock resettable output, said mechanism comprising:

a dynamic simulation mechanism for generating a first list of transition times for each element in said logic circuit of cascaded dynamic logic gates; and a precharge timing mechanism connected to said dynamic simulation mechanism for generating a second list of storage node transition times for each logic gate in said logic circuit, whereby said precharge critical path is determined from said second list.

11. The precharge timing verification mechanism of claim 10, wherein said precharge timing mechanism generates preconditioning date for utilization by said dynamic simulation mechanism in generating said first list of transition times.

12. The precharge verification mechanism of claim 10, wherein data inputted to said precharge timing verification mechanism is in the form of a netlist.

13. The precharge timing verification mechanism of claim 10, wherein said dynamic logic gates comprise zipper logic gates.

14. The precharge timing verification mechanism of claim 10, wherein said dynamic logic gates comprise domino logic gates.

15. The precharge timing verification mechanism of claim 10, further including mechanism for determining the maximum clock offset from said second list.

16. The precharge timing verification mechanism of claim 10, further including mechanism for selecting said precharge critical path from said second list.

17. A computer program product having a computer readable medium having a computer program logic recorded thereon for receiving input data from a user for enabling determination of a precharge critical path in a logic circuit of cascaded dynamic logic gates, comprising:

dynamic simulation means for generating a first list of transition times for each element in said logic circuit of said cascaded dynamic logic gates; and precharge timing means in communication with said dynamic simulation mechanism for generating a second list of storage node transition times for each logic gate in said logic circuit, whereby said precharge critical path is determined from said second list.

18. The computer program product of claim 17 further including means for selecting said precharge critical path from said second list.

19. The computer program product of claim 17, further including means for determining a maximum clock offset from said second list.

20. The computer program product of claim 17, wherein said precharged timing means generates preconditioning data for utilization by said dynamic simulation means in generating said first list of transition times.

21. The computer program product of claim 17, wherein data that is input to said precharged timing means is in the form of a netlist.

22. The computer program product of claim 17, wherein said dynamic logic gates comprise domino logic gates.

23. The computer program product of claim 17, wherein said dynamic logic gates comprise zipper logic gates.

* * * * *